United States Patent
Kim et al.

(10) Patent No.: US 8,616,907 B2
(45) Date of Patent: Dec. 31, 2013

(54) TEST SOCKET FOR TESTING ELECTRICAL CHARACTERISTICS OF A MEMORY MODULE

(75) Inventors: Jung-Hoon Kim, Asan-si (KR);
Yong-Hyun Kim, Yongin-si (KR);
Seong-Chan Han, Cheonan-si (KR);
Kwang-Su Yu, Cheonan-si (KR);
Jae-Seon Hwang, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 309 days.

(21) Appl. No.: 13/165,927

(22) Filed: Jun. 22, 2011

(65) Prior Publication Data
US 2012/0007625 A1 Jan. 12, 2012

(30) Foreign Application Priority Data
Jul. 12, 2010 (KR) ........................ 10-2010-0066955

(51) Int. Cl.
*H01R 13/15* (2006.01)
(52) U.S. Cl.
USPC .......................................... 439/260; 439/160
(58) Field of Classification Search
USPC .......... 439/160, 259, 260, 265–267, 636, 637
See application file for complete search history.

(56) References Cited

U.S. PATENT DOCUMENTS

| | | | | |
|---|---|---|---|---|
| 4,148,537 A | * | 4/1979 | Sochor | 439/267 |
| 4,824,389 A | * | 4/1989 | Doyle et al. | 439/269.1 |
| 5,154,619 A | * | 10/1992 | Matsuoka | 439/72 |
| 5,228,866 A | * | 7/1993 | Espenshade et al. | 439/266 |
| 5,462,446 A | * | 10/1995 | Ikeya | 439/264 |
| 5,508,666 A | * | 4/1996 | Nguyen | 333/33 |
| 6,824,410 B1 | | 11/2004 | Co et al. | |
| 7,338,303 B1 | * | 3/2008 | Yi et al. | 439/267 |

FOREIGN PATENT DOCUMENTS

| | | |
|---|---|---|
| JP | 2001-006834 | 1/2001 |
| KR | 2000-0013543 | 7/2000 |
| KR | 100934972 | 12/2009 |

OTHER PUBLICATIONS

English Abstract for Publication No. 2001-006834.
English Abstract for Publication No. 100934972, Publication date Dec. 23, 2009.
English Abstract for Publication No. 2000-0013543.

* cited by examiner

*Primary Examiner* — Neil Abrams
*Assistant Examiner* — Travis Chambers
(74) *Attorney, Agent, or Firm* — F. Chau & Associates, LLC

(57) ABSTRACT

A test socket may include a socket frame, a plate, a socket pin and a link. The socket frame may have a slot configured to accept an object. The plate may be free to move in the slot along an inserting direction of the object to support a lower surface of the object. The socket pin may be movably arranged in a direction substantially perpendicular to the inserting direction of the object. The socket pin may selectively make contact with a tab of the object. A link may be pivotally connected to the socket pin and the plate. Thus, the socket pin of the test socket may avoid dragging along the tab of the object during insertion, and accordingly, the tab of the object may avoid damage.

20 Claims, 4 Drawing Sheets

TEST SOCKET FOR TESTING ELECTRICAL CHARACTERISTICS OF A MEMORY MODULE

CROSS-RELATED TO RELATED APPLICATION

This application claims priority under 35 USC §119 to Korean Patent Application No. 10-2010-0066955, filed on Jul. 12, 2010 in the Korean Intellectual Property Office (KIPO), the contents of which are herein incorporated by reference in their entirety.

BACKGROUND OF THE INVENTION

1. Technical Field

The present invention relates to a test socket. More particularly, the present invention relates to a test socket for testing electrical characteristics of a memory module.

2. Discussion of the Related Art

As the speed of central processing units (CPUs) continued to increase, it is incumbent upon the manufacturers of computers and other digital electronic devices to likewise increase the speed of main memory and the speed at which the CPU can communicate with the main memory so as to fully realize the speed gains associated with modern CPUs. The speed at which the CPU can communicate with the main memory is determined by the bus structure that is responsible for passing packets of data between the CUP and the main memory. In order to make effective use of speed gains in CPUs and main memory, the bus structure must be capable of rapidly transmitting/receiving packets of data. Further, it is common for the main memory, which may include a number of memory chips, to be mounted on a printed circuit board (PCB), which may be known as a memory module. The memory module may include a set of pins that provides for electrical contact when the memory module is inserted into a socket slot, for example, in a motherboard.

After manufacturing a memory module, the memory module may be tested by inserting the module into a test socket connected to a testing device. A conventional socket for testing electrical characteristics of the memory module may be used. The socket may include a socket frame and resilient socket pins. The socket frame may have a slot configured to receive the memory module. The resilient socket pins may be arranged at both side surfaces of the slot. When the memory module may be inserted into the slot, the memory module may apply pressure to the resilient socket pins, and accordingly, the memory module may make contact with the resilient socket pins using friction (a "frictional contact" is accordingly made). Tabs of the memory module may accordingly male electrical contact with the resilient socket pins.

For example, as the memory module is inserted into the slot, the resilient socket pins may push upon the electrical lead tabs/pads of the memory module and the resilient socket pins may thereby be dragged along the tabs.

In order to insert the memory module, it may be required to apply an insertion force greater than a resilient force of the socket pins to the memory module. However, the insertion force and/or the dragging of the resilient socket pins along the tabs may cause a scratch, a breakage, a short, etc., in the tabs of the memory module.

SUMMARY

Exemplary embodiments of the present invention provide a test socket for testing electrical characteristics of a memory module without the use of a frictional contact between an object, which may be, for example, a portion of the memory module, such as memory module electrical contact tabs/pads, and a socket pin.

According to some exemplary embodiments, there is provided a test socket. The test socket may include a socket frame, a plate, a socket pin and a link. The socket frame may have a slot configured to accept an object. The plate may be movably arranged in the slot in an inserting direction of the object toward the slot to support a lower surface of the object. The socket pin may be movably arranged on a side surface of the slot in a direction substantially perpendicular to the inserting direction of the object. The socket pin may selectively make contact with a tab or notch of the object. The link may be pivotally connected to the socket pin and the plate, respectively.

In some exemplary embodiments, the test socket may further include a socket block configured to support the socket pin. The link may be pivotally connected to the socket block. The socket block may include an insulating material.

In some exemplary embodiments, the test socket may further include a latch pivotally connected to the socket frame to prevent the object in the slot from being detached. The latch may be connected to the plate. Thus, the latch may be rotated in accordance with movements of the plate. Two such latches may be arranged, one at each side of the socket frame.

In some exemplary embodiments, the test socket may further include a spring connected between the plate and a bottom surface of the slot to resiliently support the plate toward the direction substantially opposite to the inserting direction of the object.

In some exemplary embodiments, the plate may include an insulating material.

In some exemplary embodiments, the link may be arranged at both side portions and a central portion of the socket frame.

In some exemplary embodiments, the object may include a memory module or a portion thereof.

According to some exemplary embodiments, there is provided a test socket. The test socket may include a socket frame, a plate, a socket block, a socket pin, a link, a latch and a spring. The socket frame may have a slot configured to accept an object. The plate may be movably arranged in the slot in an inserting direction of the object toward the slot to support a lower surface of the object. The socket block may be movably arranged in both sides of the slot in a direction substantially perpendicular to the inserting direction of the object. The socket pin may be fixed to the socket block. The socket pin may selectively make contact with a tab of the object. The link may be pivotally connected to the socket block and the plate, respectively. The latch may have a first end pivotally connected with the socket frame to prevent the object in the slot from being detached, and a second end pivotally connected with the plate. The spring may be connected between the plate and a bottom surface of the slot to resiliently support the plate in the direction substantially opposite to the inserting direction of the object.

In some exemplary embodiments, the socket block may include an insulating material.

In some exemplary embodiments, the latch may be arranged at both sides of the socket frame.

In some exemplary embodiments, the plate may include an insulating material.

In some exemplary embodiments, the link may be arranged at both side portions and a central portion of the socket frame.

In some exemplary embodiments, the object may include a memory module or a portion thereof.

According to some exemplary embodiments, when the object inserted into the slot may press the plate, the socket pin connected to the plate via the link may be moved into the slot, and accordingly, the socket pin may make contact with the object. However, prior to the insertion, the socket pin remains clear of the object and accordingly does not drag against the object during insertion. Thus, the tab of the object may not frictionally make contact with the socket pin, and accordingly, the tab of the object may not be damaged.

BRIEF DESCRIPTION OF THE DRAWINGS

Exemplary embodiments will be more clearly understood from the following detailed description taken in conjunction with the accompanying drawings.

FIG. 1 is a plan view illustrating a test socket in accordance with some exemplary embodiments of the present invention;

FIG. 2 is a front view illustrating the test socket in FIG. 1;

FIG. 3 is a cross-sectional view taken along a line III-III' in FIG. 1;

FIG. 4 is a cross-sectional view illustrating a memory module in a slot of the test socket in FIG. 1;

FIG. 5 is a cross-sectional view taken along a line V-V' in FIG. 1; and

FIG. 6 is a cross-sectional view illustrating the memory module in the slot fixed by a latch of the test socket in FIG. 1.

DETAILED DESCRIPTION OF THE EMBODIMENTS

Figure 1:
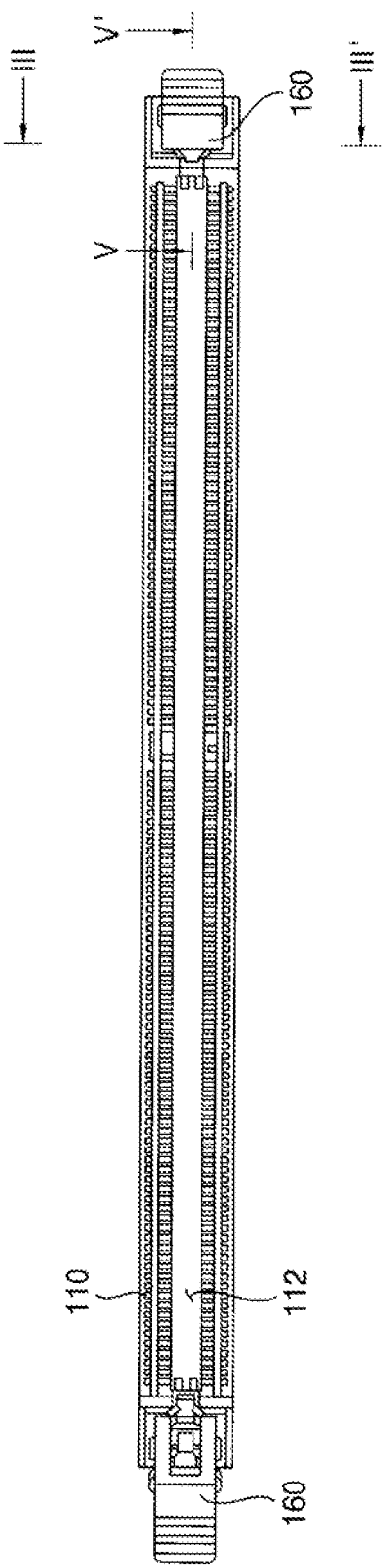
FIGS. 1 to 6 represent non-limiting, exemplary embodiments as described herein.

Various exemplary embodiments will be described more fully hereinafter with reference to the accompanying drawings. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

Exemplary embodiments are described herein with reference to cross-sectional illustrations that are schematic illustrations. As such, variations from the shapes of the illustrations as a result, for example, of manufacturing techniques and/or tolerances, may be expected. Thus, exemplary embodiments should not be construed as limited to the particular shapes of regions illustrated herein but are to include deviations in shapes that result, for example, from manufacturing.

It should be understood that although the exemplary embodiments of the present invention are illustrated and described herein as pertaining to a test socket, the socket described herein may be used as a memory module socket for receiving memory modules on a motherboard of a computer, or on another form of circuit board. Moreover, the structure illustrated and described herein is not limited to a test socket for a memory module, the described structure may be used as a test socket or actual socket for a central processing unit (CPU), a removable memory card such as an SD card, a PCI expansion card, or a test socket or actual socket for any other form of removable electronic module.

Hereinafter, exemplary embodiments will be explained in detail with reference to the accompanying drawings.

Figure 2:
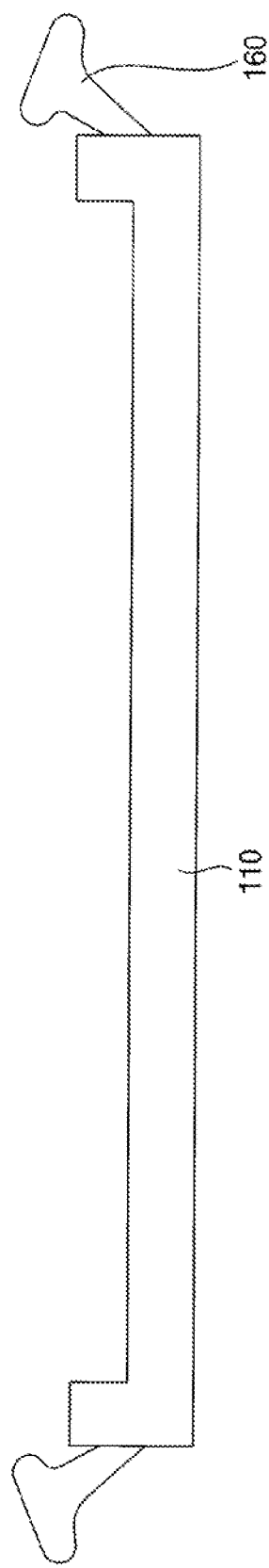
Figure 3:
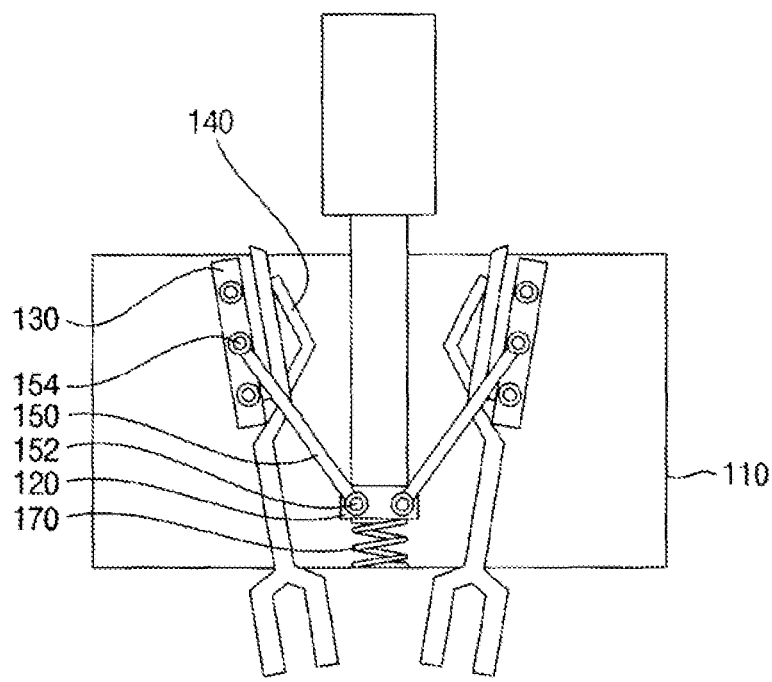
Figure 4:
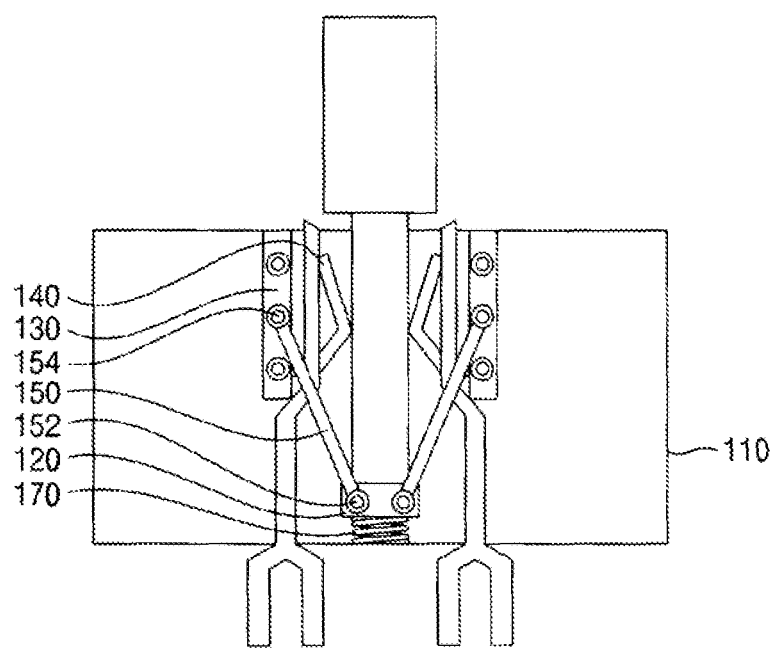
Figure 5:
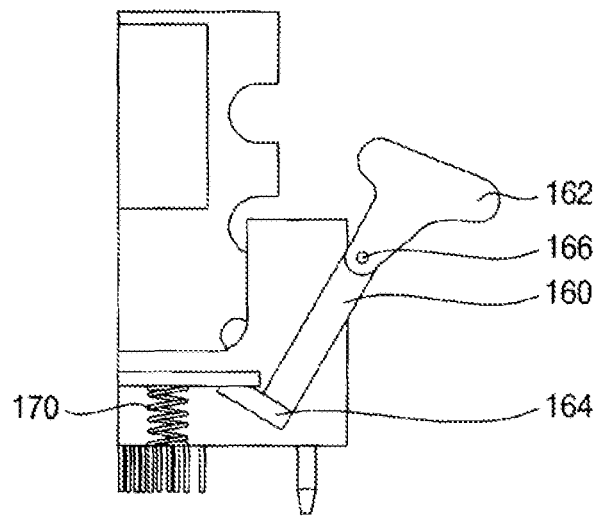
Figure 6:
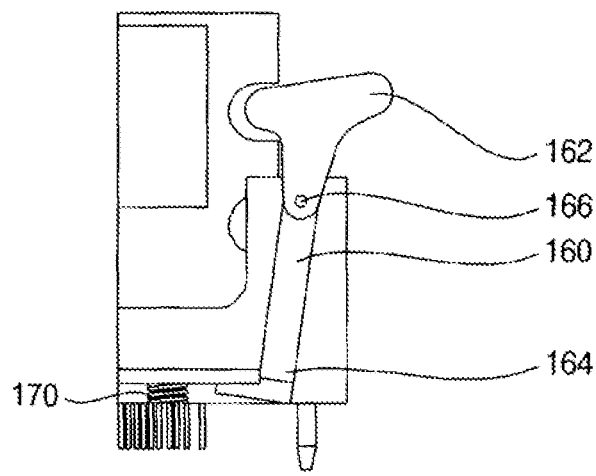

FIG. 1 is a plan view illustrating a test socket in accordance with some exemplary embodiments of the present invention. FIG. 2 is a front view illustrating the test socket in FIG. 1. FIG. 3 is a cross-sectional view taken along a line III-III' in FIG. 1. FIG. 4 is a cross-sectional view illustrating a memory module in a slot of the test socket in FIG. 1. FIG. 5 is a cross-sectional view taken along a line V-V' in FIG. 1. FIG. 6 is a cross-sectional view illustrating the memory module in the slot fixed by a latch of the test socket in FIG. 1.

Referring to FIGS. 1 to 6, a test socket 100 according to an exemplary embodiment may include a socket frame 110, a plate 120, a socket block 130, a socket pin 140, a link 150, a latch 160 and a spring 170.

The socket frame 110 may have a slot 112 configured to receive an object. In some exemplary embodiments, the object may include a memory module. The memory module may include a single in-lined memory module (SIMM), a dual in-lined memory module (DIMM), etc. The SIMM may include a printed circuit board (PCB) and semiconductor packages mounted on a single surface of the PCB. The DIMM may include a PCB and semiconductor packages mounted on both surfaces of the PCB.

In some exemplary embodiments, the memory module may have a thin plate shape. Thus, the socket frame 110 may have a long rectangular parallelepiped shape. The slot 112 may be formed at a whole upper surface of the socket frame 110.

The plate 120 may be arranged in the slot 112. The plate 120 may make contact with a lower surface of the memory module to support the memory module in the slot 112 as the memory module is inserted into the slot, and/or thereafter. In some exemplary embodiments, the plate 120 may be movably arranged in the slot 112 in an inserting direction of the memory module toward the slot 112, i.e., in a vertical direction. For example, the plate 120 may be connected with the socket frame 110 via a vertical guide (not shown). In order to firmly support the memory module with the plate 120, the plate 120 may be configured to make contact with the whole lower surface of the memory module. Alternatively, the plate 120 may include a plurality of plates configured to partially support the memory module. In order to prevent a test current from flowing through the plate 120, the plate 120 may include an insulating material.

The socket block 130 may be arranged at both sides of the slot 112. Because tabs of the memory module may be positioned at both sides of the memory module, for example, as would be the case when the memory module is a DIMM, the socket block 130 corresponding to the pair of the tabs may include a pair of blocks arranged at the both sides of the slot 112. In some exemplary embodiments, the socket block 130 may be movably arranged in the slot 112 in a direction substantially perpendicular to the inserting direction of the memory module, i.e., in a horizontal direction. Accordingly, the socket block 130 may be able to travel towards the memory module and away from the memory module. For example, the socket block 130 may be movably connected with the socket frame 110 via a horizontal guide. In order to prevent the test current from flowing through the socket block 130, the socket block 130 may include an insulating material.

The socket pin 140 may be fixed to the socket block 130. Thus, the socket pin 140 and the socket block 130 may move in tandem. The socket pin 140 may electrically make contact with the tab of the memory module, and accordingly, the test current may be supplied to the tab of the memory module through the socket pin 140. Therefore, the number of the socket pin 140 may be substantially the same as that of the tab of the memory module. According to exemplary embodiments of the present invention, the socket pin 140 may be brought into contact with the tab of the memory module at substantially the same time or after the memory module is fully engaged into the slot 112. In this way, the socket pin 140 may be prevented from dragging against the tab of the memory module as it is inserted into the test socket 100.

The link 150 may be connected between the socket block 130 and the plate 120 to interlock the socket block 130 and the plate 120 with each other. Because there may be a pair of socket blocks 130, there may also be a corresponding pair of links 150 connected between the two socket blocks 130 and the single plate 120. In some exemplary embodiments, the links 150 may be pivotally connected to the socket block 130 and the plate 120 via hinge pins 154 and 152, respectively. Thus, a vertical movement of the plate 120 may be transmitted to the socket block 130 through the link 150, and accordingly, the socket block 130 may be moved in the horizontal direction, thereby contacting the socket pin 140 with the tab of the memory module.

In some exemplary embodiments, the links 150 may be located at both sides of the socket frame 110 to support both sides of the plate 120. Additionally, in order to prevent a central portion of the plate on which the memory module may be placed from moving out of a position in which it can receive the memory module, the link 150 may be arranged at a central portion of the socket frame 110.

The latch 160 may be pivotally connected to the socket frame 110 via a hinge pin 166. The latch 160 may prevent the memory module in the slot 112 from being detached. In some exemplary embodiments, the latch 160 may have a first end 162 selectively inserted into a locking groove of the memory module, and a second end 164 configured to selectively make contact with the lower surface of the plate 120. When the memory module may press the plate 120 downwards during insertion of the memory module into the test socket 100, the plate 120 may be descended. The second end 164 of the latch 160 may be rotated about the hinge pin 166. Thus, the first end 162 of the latch 160 may be inserted into the locking groove of the memory module to prevent the memory module from being ascended. In some exemplary embodiments, in order to fix the both sides of the memory module with the latch 160, the latch 160 may be arranged at the both sides of the socket frame 110.

The spring 170 may be connected between the plate 120 and a bottom surface of the socket frame 110 to resiliently support the plate in an upward direction. In some exemplary embodiments, when the first end 162 of the latch 160 may be detached from the locking groove of the memory module, the plate 120 and the memory module may be readily ascended due to the returning force of the spring 170.

Referring to FIG. 5, before the memory module may be inserted into the slot 112, an upper end of the latch 160 may spread outwardly, and accordingly, the slot 112 may be opened. Further, as shown in FIG. 3, the socket block 130 and the socket pin 140 may be moved outwardly. Thus, the structures of the test socket may be cleared from the slot 112.

Referring to FIG. 4, when the memory module may be inserted into the slot 112, the lower surface of the memory module may press the plate 120. Thus, the plate 120 may be descended with the spring 170 being compressed. The descended plate 120 may result in movements of upper ends of the links 150 into the slot 112, and accordingly, the socket pin 140 may make contact with the tab of the memory module in the slot 112. Because the socket pin 140 may make contact with the tab of the memory module after the memory module may be inserted into the slot 112, a frictional contact between the tab and the socket pin 140 may not be generated. As a result, defects of the tab such as a scratch, a breakage, a short, etc., may not be generated.

Referring to FIG. 6, the latch 160 may be rotated about the hinge pin 166 with the descent of the plate 120. Thus, the first end 162 of the latch 160 may be inserted into the locking groove of the memory module, and accordingly, the memory module may not be detached from the slot 112 during the test.

When the testing of the memory module is finished, the first end 162 of the latch 160 may be detached from the locking groove of the memory module. The plate 120 may be ascended together with the memory module by the returning force of the spring 170, and accordingly, the memory module may be detached from the slot 112. Simultaneously, the ascent of the plate 120 may result in an outward movement of the upper end of the link 150 in the slot 112, and accordingly, the socket block 130 and the socket pin 140 may be outwardly moved in the slot 112. Therefore, the contact between the tab and the socket pin 140 may be terminated simultaneously with, or shortly before, the ascent of the memory module. As a result, the frictional contact between the tab and the socket pin 140 may not be generated and the memory module can be removed from the test socket without the socket pin 140 dragging against the tab of the memory module.

In some exemplary embodiments, the object may include the memory module. Alternatively, other objects may be applied to the test socket.

According to some exemplary embodiments, the frictional contact between the object and the socket pin may not be generated. Thus, the tab of the object may not be damaged.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the present invention. Accordingly, all such modifications are intended to be included within the scope of the present invention as defined in the claims. Therefore, it is to be understood that the foregoing is illustrative of various exemplary embodiments and the invention is not to be construed as being limited to the specific exemplary embodiments disclosed.

What is claimed is:

1. A socket comprising:
a socket frame having a slot configured to receive an object;
a plate movably arranged in the slot along an inserting direction of the object, the plate supporting a lower surface of the object;
a socket pin movably arranged at a side of the slot along a direction substantially perpendicular to the inserting direction of the object, to the socket pin selectively making contact with a tab of the object; and
a link pivotally connected to the socket pin and the plate such that the insertion or removal of the object into the slot exerts or relieves a pressure to the plate along the insertion direction of the object and as the plate travels along the insertion direction, the link transfers force from the plate to the socket pin and moves the socket pin along the direction substantially perpendicular to the insertion direction of the object,
wherein the link is configured such that the socket pin does not make contact with the tab of the object until the object is substantially fully inserted into the slot.

2. The socket of claim 1, wherein the plate comprises an insulating material.

3. The socket of claim 1, wherein the link is arranged at both side portions and a central portion of the socket frame.

4. The socket of claim 1, wherein the object is a printed circuit board and the socket is a test socket for electrically connecting the printed circuit board to a testing apparatus.

5. The socket of claim 1, further comprising a socket block configured to support the socket pin and pivotally connect the link 6. The socket of claim 5, wherein the socket block comprises an insulating material.

7. A socket comprising:
a socket frame having a slot configured to receive an object;
a plate movably arranged in the slot along an inserting direction of the object, the plate supporting a lower surface of the object;
a socket pin movably arranged at a side of the slot along a direction substantially perpendicular to the inserting direction of the object, to the socket pin selectively making contact with a tab of the object;
a link pivotally connected to the socket pin and the plate such that the insertion or removal of the object into the slot exerts or relieves a pressure to the plate along the insertion direction of the object and as the plate travels along the insertion direction, the link transfers force from the plate to the socket pin and moves the socket pin along the direction substantially perpendicular to the insertion direction of the object; and
a latch pivotally connected to the socket frame to prevent the object in the slot from being detached when the latch is engaged.

8. The socket of claim 7, wherein the latch is pivotally connected to the plate.

9. The socket of claim 8, wherein the latch is arranged at both sides of the socket frame.

10. A socket comprising:
a socket frame having a slot configured to receive an object;
a plate movably arranged in the slot along an inserting direction of the object, the plate supporting a lower surface of the object;
a socket pin movably arranged at a side of the slot along a direction substantially perpendicular to the inserting direction of the object, to the socket pin selectively making contact with a tab of the object;
a link pivotally connected to the socket pin and the plate such that the insertion or removal of the object into the slot exerts or relieves a pressure to the plate along the insertion direction of the object and as the plate travels along the insertion direction, the link transfers force from the plate to the socket pin and moves the socket pin along the direction substantially perpendicular to the insertion direction of the object; and
a spring connected between the plate and a bottom surface of the slot to resiliently support the plate in a direction substantially opposite to the inserting direction of the object.

11. A test socket comprising:
a socket frame having a slot configured to receive a memory module;
a plate movably arranged in the slot along an inserting direction of the memory module, the plate supporting a lower surface of the memory module;
a socket block movably arranged at a side of the slot along a direction substantially perpendicular to the inserting direction of the memory module;
a socket pin fixed to the socket block selectively making contact with a contact pad of the memory module;
a link pivotally connected to the socket block and the plate;
a latch pivotally connected to the socket frame, the latch having a first end for preventing the memory module in the slot from being detached, and a second end connected to the plate; and
a spring connected between the plate and a bottom surface of the slot to resiliently support the plate in a direction substantially opposite to the inserting direction of the memory module.

12. A socket for receiving a module, comprising:
a socket frame having a slot configured to receive the module;
a plate arranged within the slot such that when the module is inserted into the slot, the plate is pushed downwards and when the module is removed from the slot, the plate is permitted to return upwards on the force of a spring located beneath the plate;
a link pivotally connected to the plate at one side and pivotally connected to a block at an opposite side such that when the plate is pushed downwards by insertion of the module, the block is moved inwards towards the module by the link and when the plate is released upwards by the removal of the module, the block is moved outwards away from the module by the link; and
a pin connected to the link and configured to make contact with a contact pad of the module at substantially the same time as or shortly after full insertion of the module into the slot by virtue of the movement of the block.

13. The socket of claim 12, wherein the pin is additionally configured to break contact with the contact pad of the module at substantially the same time as or shortly after removal of the module begins by virtue of the movement of the block.

14. The socket of claim 12, wherein the socket is a test socket.

15. The socket of claim 12, wherein the module is a memory module comprising printed circuit board and one or more memory chips mounted thereon.

16. A memory module test socket, comprising:
a socket frame having a slot configured to receive the module;
one or more pins configured to travel in a direction perpendicular to an insertion direction of the memory module; and
a link configured to transfer downward force of the module into perpendicular force of the one or more pins such that the one or more pins make contact with corresponding contact pads of the memory module only when the memory module is substantially at rest after being inserted into the slot,
wherein the link is configured such that the one or more pins do not make contact with the corresponding contact pads until the memory module is substantially fully inserted into the slot.

17. The memory module test socket of claim 16, wherein the link is additionally configured to transfer upward force of the module into perpendicular force of the one or more pins such that the one or more pins break contact with the corresponding contact pads of the memory module at an early stage in the removal of the memory module from the slot.

18. The memory module test socket of claim 16, wherein the link transfers force to the one or more pins by being rotatably connected to a plate that is positioned in the slot and under the memory module.

19. The memory module test socket of claim 16, wherein the link transfers force to the one or more pins by being rotatably connected to a block that moves in a direction perpendicular to the direction of insertion of the memory module, the block configured to move in tandem with the one or more pins.

20. A memory module test socket, comprising:
a socket frame having a slot configured to receive the module;

one or more pins configured to travel in a direction perpendicular to an insertion direction of the memory module; and a link configured to transfer downward force of the module into perpendicular force of the one or more pins such that the one or more pins make contact with corresponding contact pads of the memory module only when the memory module is substantially at rest after being inserted into the slot, wherein the one or more pins are arranged such that they do not drag against the contact pads of the memory module as the memory module is inserted or removed from the slot.

\* \* \* \* \*